United States Patent [19]
Chen

[11] Patent Number: 6,096,573
[45] Date of Patent: Aug. 1, 2000

[54] METHOD OF MANUFACTURING A CMOS SENSOR

[75] Inventor: Ming I. Chen, Tainan Hsien, Taiwan

[73] Assignee: United Microelectronics Corp., Hsinchu, Taiwan

[21] Appl. No.: 09/187,022

[22] Filed: Nov. 5, 1998

[51] Int. Cl.[7] .................................................. H01L 21/00
[52] U.S. Cl. ................................................ 438/48; 438/59
[58] Field of Search ................................ 438/48, 59, 57, 438/60, 75, 73, 200, 210, 237

[56] References Cited

U.S. PATENT DOCUMENTS

| | | | |
|---|---|---|---|
| 5,913,120 | 6/1999 | Cappelletti | 438/257 |
| 6,027,955 | 2/2000 | Lee et al. | 438/57 |

*Primary Examiner*—David Nelms
*Assistant Examiner*—Dung A. Le
*Attorney, Agent, or Firm*—Hickman Stephens Coleman & Hughes, LLP

[57] ABSTRACT

A method is described for manufacturing a CMOS sensor. The method comprises the steps of providing a substrate the steps having a first conductive type, and then forming an oxide layer and a reflection layer on the substrate in sequence. The reflection layer and the oxide layer are patterned to define a sensor region, and a conductive layer having a second conductive type is formed on the reflection layer and the substrate. Thereafter, a doped region having the first conductive type is formed in a portion of the conductive layer by performing an ion implantation step. An isolation structure is formed on portions of the conductive layer adjacent to the doped region, and then a gate is formed on the doped region. Next, a lightly doped drain region having the second conductive type is formed in portions of the doped region adjacent to the gate, and a well having the second conductive type is formed in the doped region above the reflection layer, and then a spacer is formed on the sidewall of the gate. An ion implantation step is performed to form a source/drain region and a sensor region having the second conductive type at each side of the gate in portions of the doped region, and then a dielectric layer is formed over the substrate.

26 Claims, 4 Drawing Sheets

1

METHOD OF MANUFACTURING A CMOS SENSOR

BACKGROUND OF THE INVENTION

1. Field of the Invention

The present invention relates to a method of manufacturing a complementary metal-oxide semiconductor (CMOS) device. More particularly, the present invention relates to a method of manufacturing a CMOS sensor having a silicon nitride layer as an Anti-Reflection layer.

2. Description of the Related Art

Charge-coupled devices (CCDs) have been the mainstay of conventional imaging circuits for converting light into an electrical signal that represents the intensity of the energy. The applications of the CCDs include monitor, transcription machines and cameras. Although CCDs have many strengths, CCDs also suffer from high costs and the limitation of the CCDs' volume. To overcome the weaknesses of CCDs and reduce costs, dimension and energy consumption, a CMOS photo diode device is developed. Because a CMOS photo diode device can be produced using conventional technique, costs and the volume of the sensor can be reduced. The applications of CMOS photo diodes include PC cameras, digital cameras etc.

A photo diode based on the theorem of a P-N junction can convert light into an electrical signal. Before energy in the form of photons strikes the photo diode, there is an electric field in the P-N junction. The electrons in N region do not diffuse forward to P region and the holes in P region do not diffuse forward to N region. When enough light strikes the photo diode, the light creates a number of electron-hole pairs. The electrons and the holes diffuse forward to the P-N junction. While the electrons and the holes reach the P-N junction as a result of the effect of the inner electric field across the junction, the electrons flow to the N region and the holes flow to the P region. Thus a current is induced between the P-N junction electrodes. Ideally, a photo diode in the dark is open-circuit. In other words there is no current induced by light while photo diode is in the dark.

FIG. 1 is a schematic, cross-sectional view of a portion of a semiconductor device showing a conventional CMOS sensor. In FIG. 1, the conventional CMOS sensor includes a P-type substrate 100, a field oxide layer 104, a P-type well 110, a gate structure 120, an N-type source/drain region 122, an N-type sensor region 124, an depletion region 126, and a borophosphosilicate glass/silicon nitride glass dielectric layer.

When a light beam 140 passes through the depletion region 126 which works as an P-N junction, the depletion region 126 is excited and a number of electron-hole pairs are created. Thus the light is converted into an electric signal. Because the light beam 140 strikes the depletion region 126 just once, the effective interaction length is short. The intensity of electric signal is small to result in a low contrast ratio of brightness. That is, the sensitivity is low. Moreover, the light beam 140 passing though the depletion region 126 is absorbed by the substrate 100. This produces unnecessary current and induces substrate leakage.

SUMMARY OF THE INVENTION

It is therefore an objective of the present invention to provide a method of manufacturing a CMOS sensor having a silicon nitride layer as an Anti-Reflection layer. The silicon nitride layer can reflect the incident light beam though the depletion region, and the reflected light beam is absorbed by the sensor. Thus the effective interaction length is increased.

It is another an objective of the present invention to provide a method of manufacturing a CMOS sensor having a silicon nitride layer as an Anti-Reflection layer, which can increase the absorption of an incoming light and the contrast ratio of brightness, that is, the sensitivity of the sensor.

It is yet another objective of the present invention to provide a method of manufacturing a CMOS sensor having a silicon nitride layer as an Anti-Reflection layer. The silicon nitride layer can work as a buffer layer and prevent leakage current.

To achieve these and other advantages and in accordance with the purpose of the invention, as embodied and broadly described herein, the invention provides a method of manufacturing a CMOS sensor having a silicon nitride layer as an Anti-Reflection layer. The method comprises the steps of providing a substrate having a first conductive type, and then forming an oxide layer and a reflection layer on the substrate in sequence. The reflection layer and the oxide layer are patterned to define a sensor region, and a conductive layer having a second conductive type is formed on the reflection layer and the substrate. Thereafter, a doped region having the first conductive type is formed in a portion of the conductive layer by performing an ion implantation step. An isolation structure is formed on portions of the conductive layer adjacent to the doped region, and then a gate is formed on the doped region. Next, a lightly doped drain region having the second conductive type is formed in portions of the doped region adjacent to the gate, and a well having the second conductive type is formed in the doped region above the reflection layer, and then a spacer is formed on the sidewall of the gate. An ion implantation step is performed to form a source/drain region and a sensor region having the second conductive type at each side of the gate in portions of the doped region, and then a dielectric layer is formed over the substrate.

The sensor region is formed by conventional processing techniques and the region between the sensor and the substrate has a well that is a P-N junction. Because the refraction index of the sensor region and the well are both larger than that of the silicon nitride layer, an incident light beam will be completely reflected by the interface between the silicon nitride layer and the substrate. Thus the effective interaction length is increased and the incident light beam absorbed by the substrate is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
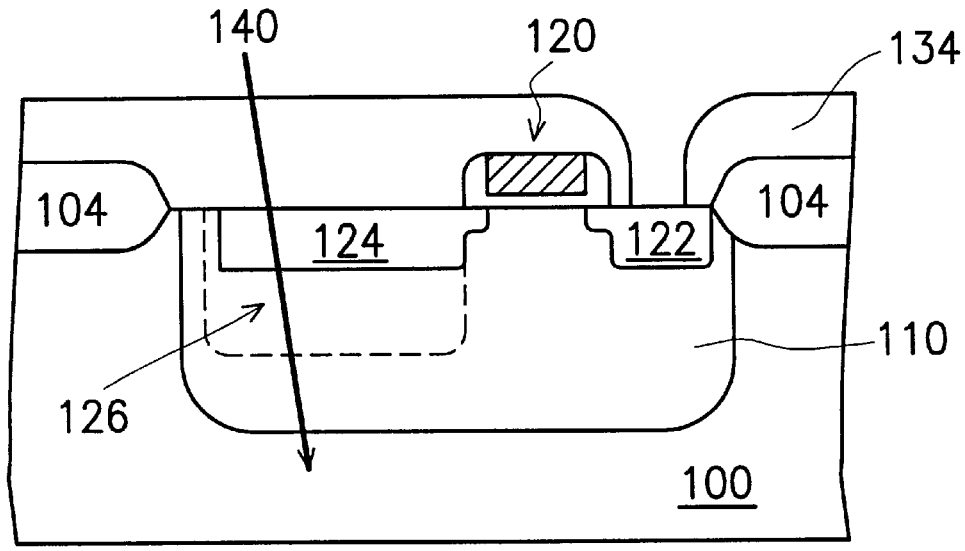
FIG. 1 is a schematic, cross-sectional view of a portion of a semiconductor device showing a conventional CMOS sensor.

Reference will now be made in detail to the present preferred embodiments of the invention, examples of which are illustrated in the accompanying drawings. Wherever possible, the same reference numbers are used in the drawings and the description to refer to the same or like parts.

FIG. 2A through 2H are schematic, cross-sectional views of a portion of a semiconductor device showing a CMOS sensor according to one preferred embodiment of the invention.

Figure 2A:
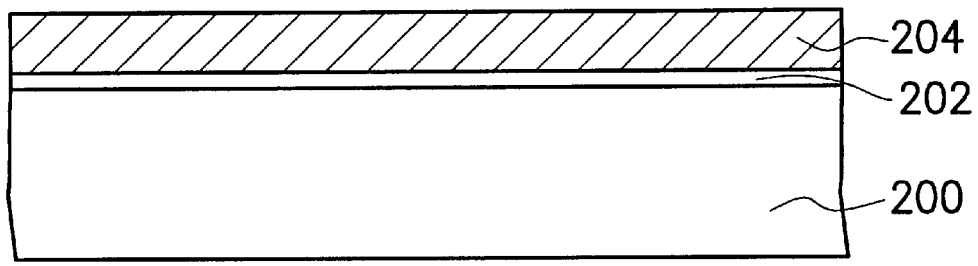
FIG. 2A through 2H are schematic, cross-sectional views of a portion of a semiconductor device showing a CMOS sensor according to one preferred embodiment of the invention.

First, as shown in FIG. 2A, a substrate 200 having a first conductive type is provided. The first conductive type can be a P-type, for example. An oxide layer 202 and a reflection layer 204 are formed on the substrate 200 in sequence. The reflection layer 204 can be made from silicon nitride or silicon-oxy-nitride, for example. The reflection layer 204 has a thickness between about 1000 Å and 3000 Å, and the refraction index of the reflection layer 204 is about 2.05.

Figure 2B:
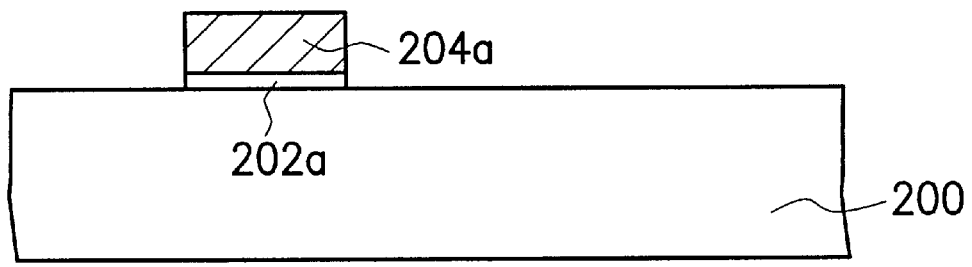

As shown in FIG. 2B, the oxide layer 202 and the reflection layer 204 are patterned to define the position of a sensor region formed subsequently. The position above the residual reflection layer 204a is the position in which the sensor region is to be formed subsequently.

Figure 2C:
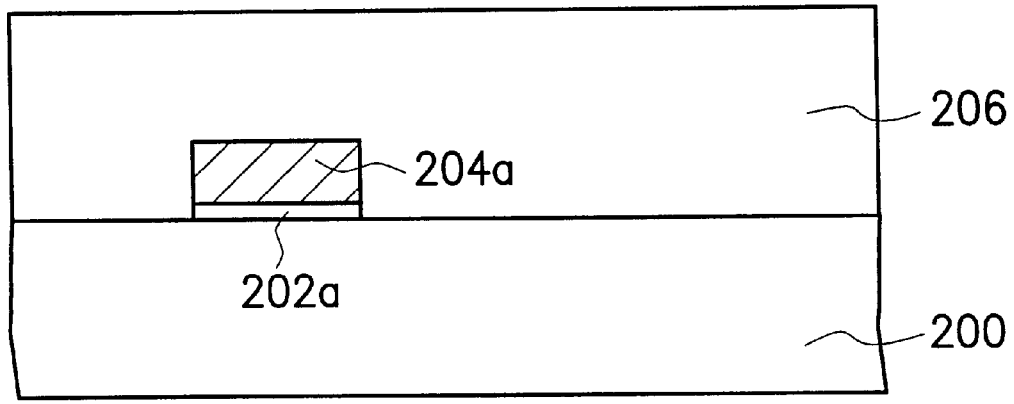

As shown in FIG. 2C, a conductive layer 206 having a second conductive type is formed to cover the silicon nitride layer 204a and the substrate 200. The conductive layer 206 can be made from silicon epitaxy, for example. The refraction index of the conductive layer 206 is about 3.42 and the second conductive type can be an N-type, for example.

Figure 2D:
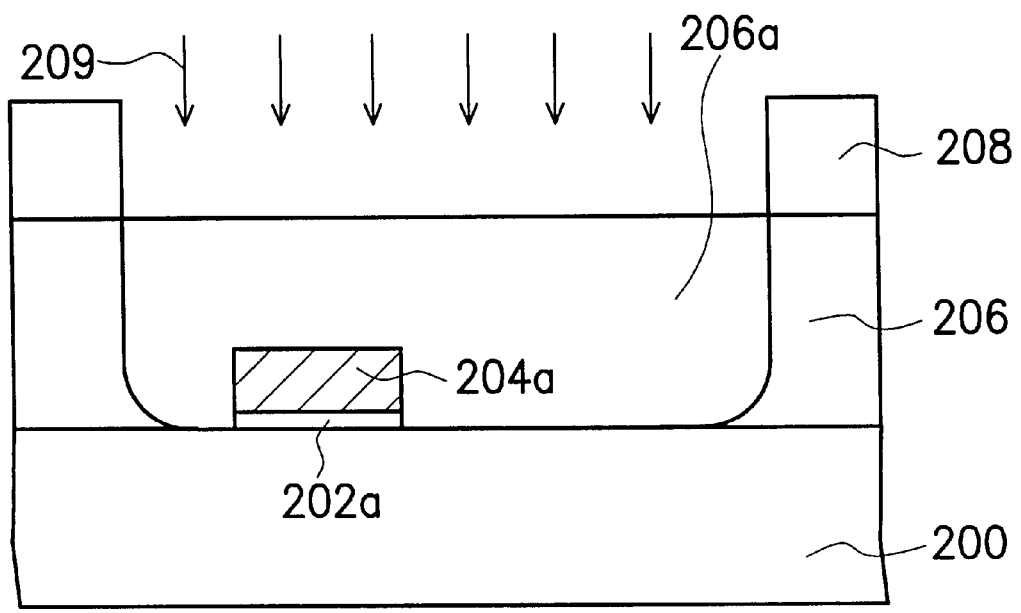

As shown in FIG. 2D, an ion implantation step 209 is used to form a doped region 206a having the first conductive type in the conductive layer 206 exposed by the photoresist mask 208. The doped region 206a, for example, can be a P-type well. The range of the doped region 206a includes the silicon nitride layer 204a.

Figure 2E:
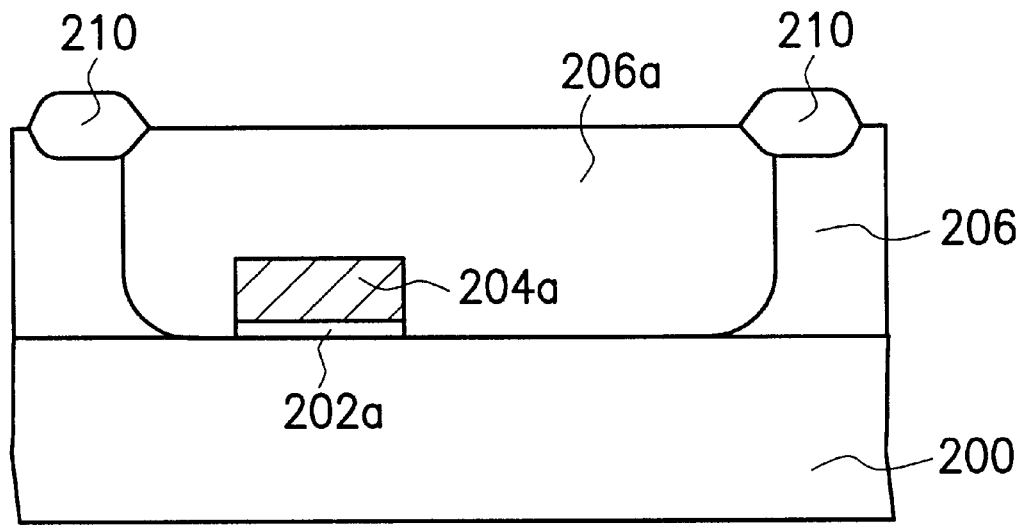

As shown in FIG. 2E, after the photoresist mask 208 is stripped, an isolation structure 210 is formed on portions of the conductive layer 206 adjacent to the doped region 206a. The isolation structure 210 can be a field oxide layer or other isolation structure, for example.

Figure 2F:
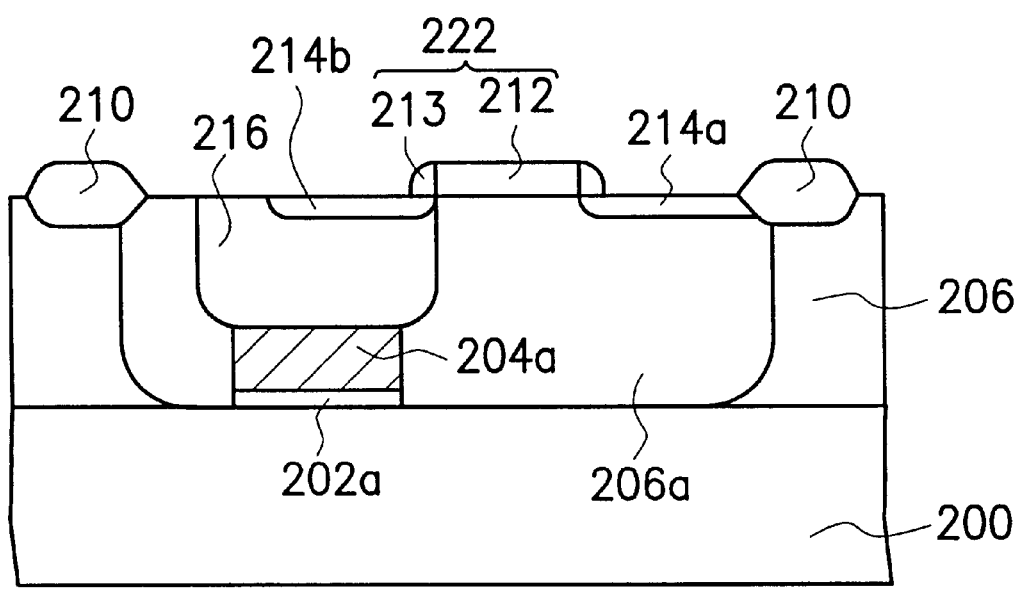

As shown in FIG. 2F, a gate 212 is formed on the doped region 206a by conventional processing techniques well known to those skilled in the art. Doped drain regions 214a and 214b having the second conductive type are formed in portions of the doped region 206a adjacent to the gate 212, and the doped drain region 214a and 214b are formed by an ion implantation step. The doped drain regions 214a and 214b having the second conductive type can be N-type doped drain regions, for example. Since the conductive type of the doped region 206a and that of the doped drain region 214b are different, the P-N junction occurs between the doped region 206a and the doped drain region 214b. Therefore, a depletion region is formed across the junction. A spacer 213 is formed on the sidewall of the gate 212. A gate structure 222 is thus formed and comprises the spacer 213 and the gate 212. A well 216 having the second conductive type is formed by implanting ions having the second conductive type in a portion of the doped region 206a between the doped drain region 214b and the reflection layer 204a. In this example, the well 216 having the second conductive type is denoted as an N$^-$-type well, wherein the N$^-$ type indicates that the dopant concentration of the N$^-$ type is lighter than that of the N type. The well 216 is formed to adjust the range of the depletion region. The refraction index of the well 216 is either larger than the reflection layer 204a under the well 216 or larger than a dielectric layer later formed over the substrate.

Figure 2G:
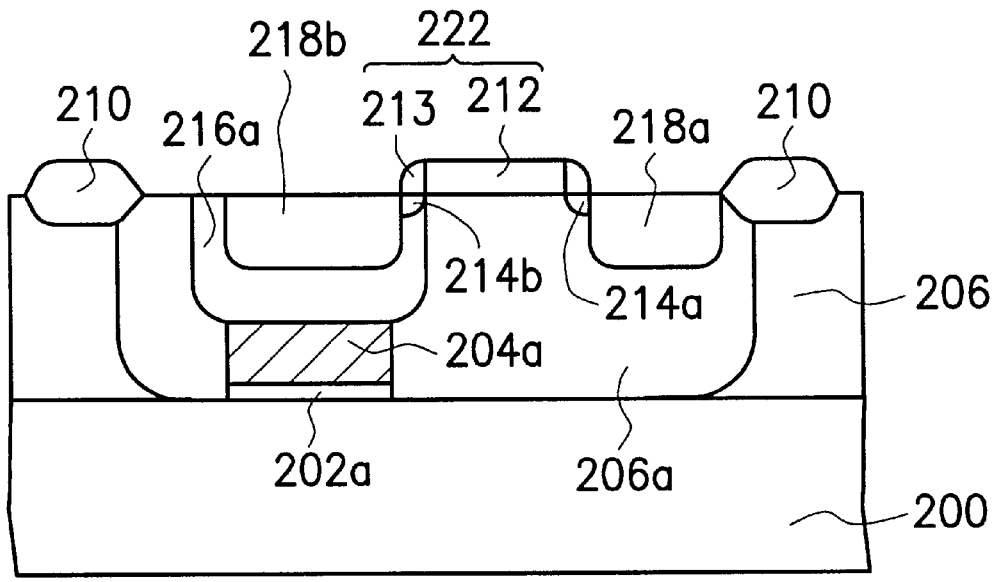

As shown in FIG. 2G, a source/drain region 218a having the second conductive type is formed on one side of the gate structure 222 in the doped region 206a by performing an ion implantation step. A sensor region 218b having a second conductive type is formed on the other side of the gate structure 222 aligned over the reflection layer 204a in the well 216 by performing an ion implantation step. When the concentrations of the dopants are the same, the source/drain region 218a and the sensor region 218b can be formed in the same ion implantation step. In this example, the source/drain region 218a and the sensor region 218b having the second conductive type is denoted as an N$^+$-type source/drain region and an N$^+$-type sensor region, wherein the N$^+$ type indecates that the dopant concentration of the N$^+$ type is heavier than that of the N type. While the concentrations of the dopants are required to be different, the source/drain region 218a and the sensor region 218b can be formed in sequential steps.

Figure 2H:
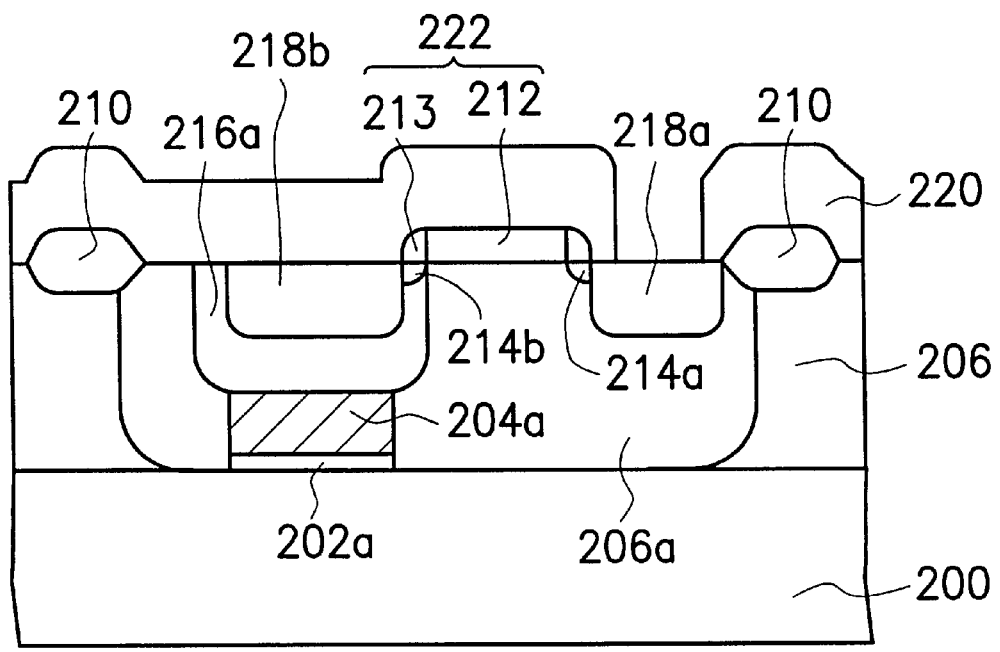

As shown in FIG. 2H, a dielectric layer 220 is formed over the whole substrate 200. The dielectric layer 220 can be a borophosphosilicate glass layer or other dielectric layer, for example, and the refraction index of the dielectric layer 220 is about 1.46. The dielectric layer 220 is etched to expose a portion of the source/drain region 218a.

In the structure provided in one preferred embodiment of the invention, the depletion region between the well 216a and the doped region 206a is excited by an incident light beam to produce electron-hole pairs and induce current in the depletion region. Thus it is a device which can convert light into an electric signal. Because the refraction index of the depletion region and the substrate 200 are both larger than the reflection layer 204a, the incident light beam will be reflected from the reflection layer back to the sensor region 218b. Furthermore, the optical path is increased, so that the effective interaction length and the absorption of sensor 218b are increased, and thus the signal intensity is increased. Moreover, a complementary photo diode structure can also be obtained by interchanging P for N and N for P.

Additionally, the incident light beam cannot easily pass through the reflection layer 204a, so the light absorbed by the substrate 200 is decreased, and the leakage of the substrate 200 will is avoided.

The CMOS sensor provided by the present invention can decrease substrate leakage. Further more, there is a reflection layer, so the signal intensity of current induced by photons is increased. For the same reason, the ON/OFF ratio of the CMOS sensor and the sensitivity of the sensor are also increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a CMOS sensor, comprising the steps of:
   providing a substrate having a first conductive type;
   forming an oxide layer and a reflection layer on the substrate;
   forming a conductive layer having a second conductive type with a first concentration on the reflection layer and the substrate;
   forming a doped region having the first conductive type to cover the reflection layer in the conductive layer;
   forming an isolation structure on portions of the conductive layer adjacent to the doped region;

forming a gate on the doped region;

forming a doped drain region having the second conductive type with the first concentration in the doped region adjacent with the gate as a mask;

forming a well having the second conductive type with a second concentration in the doped region above the reflection layer;

forming a spacer on a sidewall of the gate;

performing an ion implantation step to form a source/drain region having the second conductive type with a third concentration on one side of the gate in the doped region and a sensor region having the second conductive type with a fourth concentration aligned over the reflection layer at the other side of the gate in the doped region; and forming a dielectric layer on the substrate.

2. The method of claim 1, wherein the first conductive type is P type and the second conductive type is N type.

3. The method of claim 1, wherein the first conductive type is N type and the second conductive type is P type.

4. The method of claim 1, wherein the fourth concentration is higher than the first concentration, and the first concentration is higher than the second concentration.

5. The method of claim 4, wherein the fourth concentration is equal to the third concentration.

6. The method of claim 1, wherein the fourth concentration is equal to the third concentration.

7. The method of claim 1, wherein the reflection layer and oxide layer define the position of a sensor region formed subsequently.

8. The method of claim 1, wherein the reflection layer is between about 1000 Å and 3000 Å thick.

9. The method of claim 1, wherein the reflection layer includes a silicon nitride layer.

10. The method of claim 1, wherein the reflection layer includes a silicon-oxy-nitride layer.

11. The method of claim 1, wherein the conductive layer includes a silicon epitaxy layer.

12. The method of claim 1, wherein the isolation structure includes a field oxide layer.

13. The method of claim 1, wherein the dielectric layer includes a borophosphosilicate glass layer.

14. A method of manufacturing a CMOS sensor, comprising the steps of:

providing a substrate;

forming an oxide layer and a reflection layer on the substrate;

forming a conductive layer having a first conductive type with a first concentration on the reflection layer and the substrate;

forming a gate on the conductive layer;

forming a doped drain region having the second conductive type with the first concentration in the doped region adjacent with the gate as a mask;

forming a well having the second conductive type with a second concentration in the conductive layer above the reflection layer;

forming a spacer on the sidewall of the gate;

performing an ion implantation step to form a source/drain region having the second conductive type with a third concentration on one side of the gate in the conductive layer and a sensor region having the second conductive type with a fourth concentration aligned over the reflection layer at the other side of the gate in the conductive layer; and forming a dielectric layer on the substrate.

15. The method of claim 14, wherein the first conductive type is P type and the second conductive type is N type.

16. The method of claim 14, wherein the first conductive type is N type and the second conductive type is P type.

17. The method of claim 14, wherein the fourth concentration is higher than the first concentration, and the first concentration is higher than the second concentration.

18. The method of claim 17, wherein the fourth concentration is equal to the third concentration.

19. The method of claim 14, wherein the fourth concentration is equal to the third concentration.

20. The method of claim 14, wherein the reflection layer and oxide layer define the position of a sensor region formed subsequently.

21. The method of claim 14, wherein the reflection layer is between about 1000 Å and 3000 Å thick.

22. The method of claim 14, wherein the reflection layer includes a silicon nitride layer.

23. The method of claim 14, wherein the reflection layer includes a silicon-oxy-nitride layer.

24. The method of claim 14, wherein the conductive layer includes a silicon epitaxy layer.

25. The method of claim 14, wherein the isolation structure includes a field oxide layer.

26. The method of claim 14, wherein the dielectric layer includes a borophosphosilicate glass layer.

* * * * *